United States Patent [19]

Maruyama

[11] Patent Number: 5,367,981
[45] Date of Patent: Nov. 29, 1994

[54] APPARATUS FOR MANUFACTURING CRYSTALS THROUGH FLOATING ZONE METHOD

[76] Inventor: Mitsuhiro Maruyama, 44-29, Wada 1-chome, Suginami-ku, Tokyo, Japan

[21] Appl. No.: 43,833

[22] Filed: Apr. 7, 1993

[30] Foreign Application Priority Data

Apr. 10, 1992 [JP] Japan ................................ 4-091043

[51] Int. Cl.⁵ .............................................. C30B 29/06
[52] U.S. Cl. ...................................... 117/200; 117/49; 117/207
[58] Field of Search ...................... 156/602, 603, 616.3, 156/620.7, 620.72, 620.73, DIG. 115; 422/250, 251

[56] References Cited

U.S. PATENT DOCUMENTS

| | | | |
|---|---|---|---|
| 2,970,895 | 2/1961 | Clark et al. ........................... | 156/602 |
| 3,086,850 | 4/1963 | Marino, Jr. et al. ............ | 156/620.73 |
| 3,870,472 | 3/1975 | Adamski et al. ................... | 156/603 |
| 5,108,720 | 4/1992 | Bourbina et al. .......... | 156/DIG. 115 |
| 5,211,802 | 5/1993 | Kaneko et al. ................... | 156/620.7 |

Primary Examiner—R. Bruce Breneman
Assistant Examiner—Felisa Garrett
Attorney, Agent, or Firm—Wegner, Cantor, Mueller & Player

[57] ABSTRACT

A apparatus for manufacturing crystals through a floating zone method which includes: structure for forming a heat-melt zone so as to be held at an upper portion of a solid crystal; a barrier enclosure having an opening a lower end portion and provided in the vicinity of an upper surface of the heat-melt zone; structure for supplying a raw material granular crystal into the barrier enclosure; and structure for moving the solid crystal and the heat-melt zone forming structure relative to each other to thereby bring about crystal growth, wherein the barrier enclosure has a bottom surface being flat or inclined toward the center of the barrier enclosure, and wherein the opening is constituted by at least one hole formed in the bottom surface of the barrier enclosure.

10 Claims, 5 Drawing Sheets

APPARATUS FOR MANUFACTURING CRYSTALS THROUGH FLOATING ZONE METHOD

BACKGROUND OF THE INVENTION

The present invention relates to a process of manufacturing crystals through a floating zone method in which raw material granular crystals are supplied continuously to obtain an ingot of monocrystals or polycrystals (semiconductors such as silicon, metals, alloys, oxides, and other compounds), and relates to an apparatus for carrying out the process.

In recent years, semiconductor wafers, particularly silicon wafer substrates, have been extensively used in solar cells, integrated circuits (ICs) and ultra large scale integrated circuits (ULSIs). As the method of manufacturing silicon monocrystals constituting substrates of this type, there is mainly used either a Czochralski method (hereinafter referred to as "CZ method") or a floating melt method (hereinafter referred to as "FZ method"). The CZ method can make large-sized crystals easily, while the FZ method can make high-purity crystals easily. The two types of manufacturing methods are selected in accordance with the purpose of use. However, the required quality of crystals has been more rigorous with the advance of integration of circuits, and improvement of the purity of crystals and remarkable reduction of cost in accordance with mass production have been required more greatly.

FIG. 5 is a view of a conventional apparatus for manufacturing crystals by crystal growth through the FZ method. FIG. 5 shows an equilibrium state at the time of crystal growth.

In FIG. 5, the reference numeral 1 designates a grown monocrystal; 2, a melt zone in a silicon bar; 3, a polycrystalline ingot as a raw material; 4, a high frequency coil; and 9, a seed crystal. In the same drawing, the raw material polycrystalline ingot 3 which is formed so as to taper to its lower end is made to approach the high frequency coil 4 so that the lower end portion of the ingot 3 is melted by induction heating (in general, 1 to 3 MHz). In this occasion, the melt is held at the lower end portion of the ingot by surface tension. When the seed crystal 9 is moved down while it is rotated after it is brought into contact with the melt at the lower end portion (that is, after seeding), monocrystal growth occurs.

The crystal 1 thus grown up from the seed crystal 9 has an enlarged size. The melt zone 2 is formed on the upper surface of the crystal 1. When the raw material crystal ingot 3 is further moved down so that the seed crystal 9 is moved down in accordance with the movement of the raw material crystal ingot 9, the melt is supplied to the melt zone 2 so that the size of the monocrystal 1 is enlarged greatly. After the size of the monocrystal 1 reaches a predetermined value, the growing of the monocrystal 1 is continued while its size is kept in the predetermined value. FIG. 5 shows an equilibrium state in this occasion. That is, the melt in the melt zone 2 is formed so that it is connected to the upper end portion of the grown crystal 1 at the lower end portion of the raw material crystal ingot 3 and held therein. In the case, alternatively, the high frequency coil 4 may be moved upward. Further, the raw material 3 and the monocrystal 1 are rotating relative to each other.

In the conventional FZ method, the volume of the polycrystalline ingot 3 required as a raw material is substantially equal to or not less than the volume of the monocrystal 1 to be produced. An ingot having a size substantially equal to or smaller than the diameter of the monocrystal 1 is used generally. Furthermore, adjustment of the shape (diameter shape, forward end shape, and holding portion shape) of the raw material ingot 3 and cleaning (etching, cleaning with pure water, and drying) of the raw material ingot 3 are required, so that a large processing loss is produced. Furthermore, the conventional manufacturing apparatus is large-sized because it requires a chamber for storing the raw material ingot 3 (generally with the length of from 1 m to 1.5 m), a mechanism for holding the raw material ingot 3 and a mechanism for moving the raw material ingot 3.

SUMMARY OF THE INVENTION

An object of the present invention is therefore to provide a process of manufacturing crystals through a floating zone method, in which the problems in the prior art can be eliminated and in which a very small size raw material ingot is used or no raw material ingot is used so that not only the size of an apparatus can be reduced but both saving of electric power and reduction of the processing loss can be attained.

Another object of the present invention is to provide an apparatus for carrying out the process.

The foregoing objects of the present invention are attained by a process of manufacturing crystals through a floating zone method, which comprises the steps of: forming a heat-melt zone so as to be held at an upper portion of a solid crystal; providing a barrier enclosure in the vicinity of an upper surface of the heat-melt zone; and supplying a raw material granular crystal into the barrier enclosure to grow a crystal on the solid crystal.

The process according to the present invention is carried out by an apparatus for manufacturing crystals through a floating zone method, which comprises: means for forming a heat-melt zone so as to be held at an upper portion of a solid crystal; a barrier enclosure having an opening at its lower end portion and provided in the vicinity of an upper surface of the heat-melt zone (so that the opening is slightly separated from an upper surface of the heat-melt zone or coincident with the upper surface thereof or slightly immersed in the heat-melt zone); means for supplying a raw material granular crystal into the barrier enclosure; and means for moving the solid crystal and the heat-melt zone forming means relative to each other to thereby bring about crystal growth.

Preferably, the heat-melt zone forming means may be constituted by a high frequency induction heating device.

Preferably, the barrier enclosure may have a bottom surface being flat or inclined toward the center of the barrier enclosure, and the opening is constituted by at least one hole formed in the bottom surface of the barrier enclosure. In this case, seeding is performed through the at least one hole.

Preferably, at least one flat plate may be provided in the vicinity of a bottom side portion of the barrier enclosure so as to be disposed concentrically or radially along the outer circumference of the barrier enclosure.

Preferably, a magnetic field applying means may be provided for applying a magnetic field to a melt region of the heat-melt zone (floating zone).

The operation of the invention based on the above-mentioned configuration will be described below.

In the conventional FZ method, a raw material ingot (solid phase) kept in air, a melt (liquid phase) and a grown crystal (solid phase) for holding the melt are connected as a solid-liquid-solid phase combination to thereby hold a melt zone. It is therefore necessary to prepare a large-size preliminarily processed raw material ingot, so that energy for pre-heating is required. Furthermore, a mechanism for holding the large-size raw material ingot and a chamber for holding the ingot are required, so that a large-scale manufacturing equipment is required. On the contrary, according to the present invention, granular crystals can be used as a raw material, the granular crystals being provided separately, without any connection, independent of the melt zone (liquid phase) and the grown crystal (solid phase). By utilizing the fluidity of the granular crystals, a large quantity of raw material granular crystals can be supplied continuously from the outside by means of a simple-structure small-size granular matter transporting device. Accordingly, preparation of such a large-size preliminarily processed raw material ingot is not required, so that energy for pre-heating thereof can be saved. For example, required electric power can be saved by a value in a range of from 30% to 40% compared with that in the conventional FZ method. Furthermore, the ingot holding mechanism and the ingot driving mechanism are not required. Accordingly, the size of the manufacturing apparatus can be reduced greatly. For example, the height of the apparatus can be reduced by a value in a range of from 40% to 50% compared with that in the conventional FZ method. Accordingly, not only equipmental cost can be reduced but space saving and energy saving can be attained. Furthermore, a large-size monocrystal (large-diameter large-length monocrystal) or an ingot can be produced easily from the granular crystals, so that efficiency in production can be improved to thereby make remarkable cost reduction possible.

In comparison with the conventional CZ method, according to the present invention, it is unnecessary to use expendables such as an expensive large-size quartz crucible, a carbon crucible, etc. Accordingly, it is a matter of course that there is less contamination with impurities, heavy metals, etc. introduced by the expendables and that high purification is attained easily. In the conventional CZ method, the possibility that accidents are caused by factors such as leakage of molten metal out of such a crucible, dropping of crystals, etc. increases because a large quantity of the melted raw material is kept at a high temperature for a long time. On the contrary, according to the present invention, improvement of safety and saving of energy can be attained because the melt zone region can be reduced extremely.

Further, according to the present invention, a barrier enclosure is provided so that prevention of raw material loss caused by scattering of crystal particles, prevention of flowing of floating matter (for example, oxides) from surfaces of raw material crystal particles to a surface of the melt, prevention of deformation and polycrystallization of the ingot and prevention of electric discharging can be attained when granular crystals are supplied as a raw material. Further, because the granular crystals in the barrier enclosure are subjected to pre-heating and concentrated heating in accordance with the electric field so as to be melted rapidly (for example, in several seconds), the thus melted raw material is supplied to the floating melt zone continuously and smoothly so that a large-size monocrystal or a large-size polycrystalline ingot as a target can be obtained easily. Further, a variable adjustment can be made so that a crystal having a desirable resistivity can be obtained on the way to crystal growth by adding a desirable dopant to the raw material crystals on the way to crystal growth.

Further, according to the present invention, seeding is performed by using a hole or holes provided in the bottom portion of the barrier enclosure. Accordingly, a large-scale ingot can be produced by using granular crystals and a seed crystal in all the steps of the process without any necessity of switching from the raw material ingot to the granular raw material.

DESCRIPTION OF THE PREFERRED EMBODIMENTS

The present invention will be described below with reference to the drawings.

Figure 1:
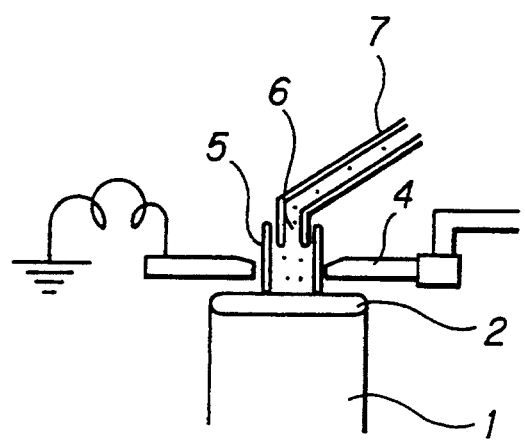
FIG. 1 is a sectional diagram of a manufacturing apparatus for explaining an embodiment of the present invention.
Figure 2A:
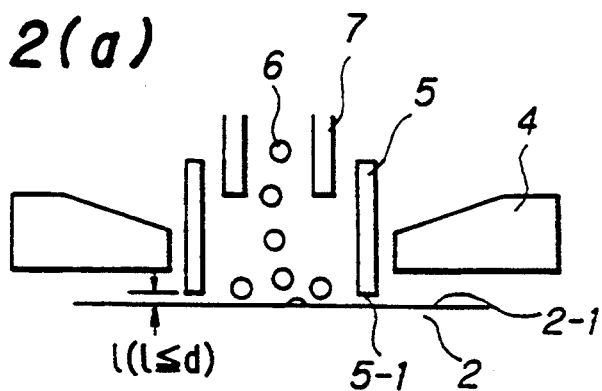
FIGS. 2A to 2C are diagrams of main part of the manufacturing apparatus for explaining the embodiment of the present invention.
Figure 2B:
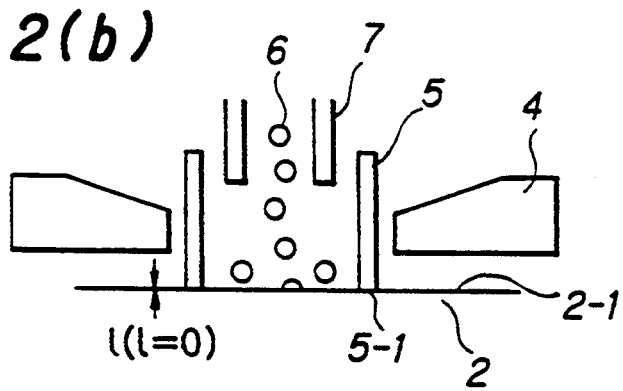
Figure 2C:
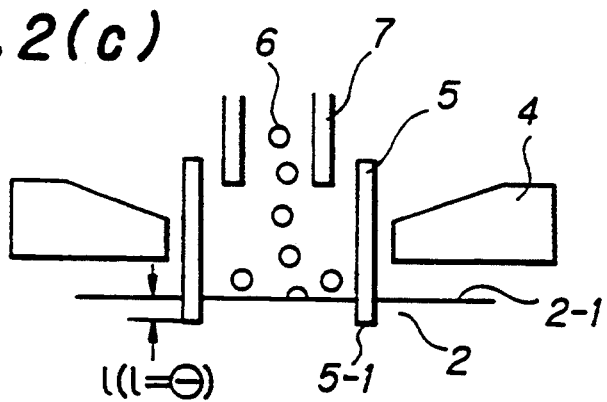
Figure 3A:
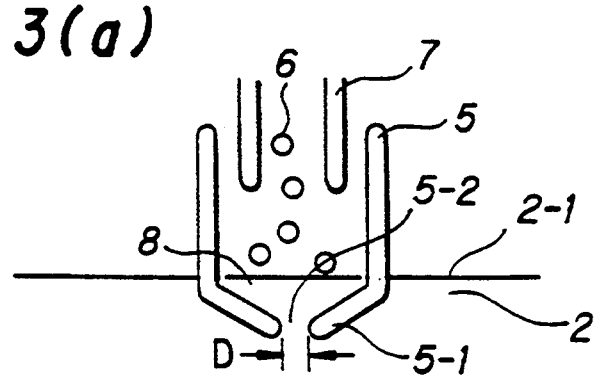
FIGS. 3A to 3C are diagrams of main part of a manufacturing apparatus for explaining another embodiment of the present invention.
Figure 3B:
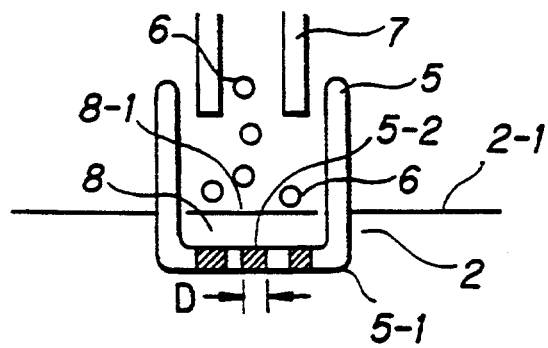
Figure 3C:
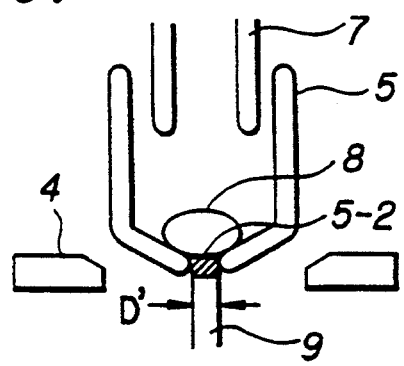
Figure 4A:
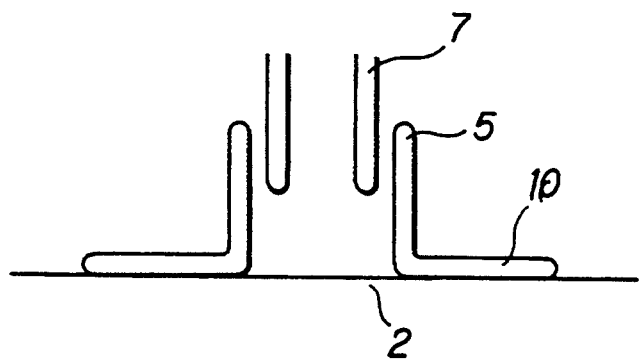
FIGS. 4A and 4B are diagrams of main part of a manufacturing apparatus for explaining a further embodiment of the present invention.
Figure 4B:
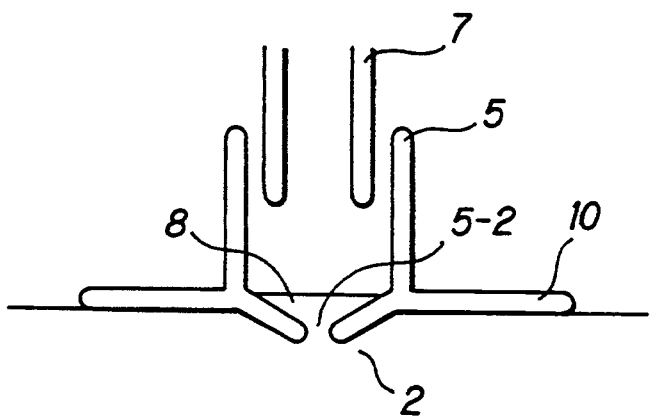

FIG. 1 and FIGS. 2A to 2C are diagrams of a manufacturing apparatus for explaining a first embodiment of the present invention. Specifically, FIG. 1 shows an apparatus for manufacturing an ingot of silicon semiconductor monocrystals or polycrystals through a floating zone method; and FIGS. 2A to 2C show the structure and arrangement of a barrier enclosure used in the manufacturing apparatus depicted in FIG. 1. FIGS. 3A to 3C are sectional diagrams of the manufacturing apparatus for explaining third and fourth embodiments of the present invention. FIGS. 4A and 4B are sectional diagrams of the manufacturing apparatus for explaining a fifth embodiment of the present invention. In each of the drawings, parts the same as or equivalent to each other are referenced correspondingly.

In the following embodiments, a process of manufacturing a semiconductor of silicon monocrystals through a floating zone method will be described in detail.

Figure 5:
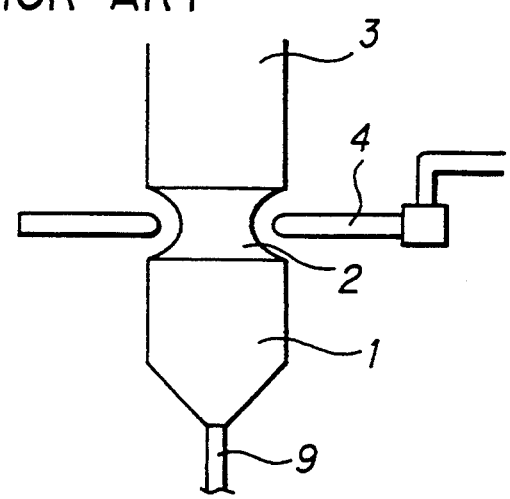
FIG. 5 is a sectional diagram of a conventional manufacturing apparatus for explaining a conventional floating zone method.

Referring now to FIG. 1 and FIGS. 2A through 2C, the first embodiment of the present invention will be described below. In FIG. 1, the reference numeral 1 designates an ingot formed in advance; 2, a melt zone; 4, a high frequency coil; 5, a barrier enclosure; 6, granular crystals; and 7, a guide pipe. In this embodiment, the melt zone 2 is formed at an upper portion of the preliminarily formed ingot 1 by induction heating based on the output of the high frequency coil 4. In this case, the grown ingot used in the initial crystal growing stage may be shaped preliminarily by mechanical processing or may be shaped by crystal growth in accordance with a general method shown in FIG. 5.

The barrier enclosure 5 is disposed in the vicinity of a surface 2-1 of the melt zone 2 so as to be within a range of the diameter of the melt zone 2. FIGS. 2A to 2C show the positional relationship between a bottom portion 5-1 of the barrier enclosure 5 and the surface 2-1 of the melt zone 2. That is, when the distance between the bottom portion 5-1 of the barrier enclosure 5 and the surface 2-1 of the melt zone surface 2 and the diameter of the granular crystals 6 are represented by l and d respectively, FIG. 2A, 2B and 2C show the respective cases of $l \leqq d$, $l=0$ and $l<0$. That is, FIG. 2C shows the case where the bottom portion of the barrier enclosure is immersed in the melt. Although these cases are selected suitably in accordance with the purpose and condition of use, the case of FIG. 2B or the case of FIG. 2C is used generally. Then, the granular crystals 6 are guided from the upper portion of the barrier enclosure 5 to the inside of the barrier enclosure 5 by the guide pipe 7 so as to be introduced into the melt zone 2.

At this time, if there is provided no barrier enclosure 5, that is, if the surface of the barrier enclosure 5 is provided as a free surface, the granular crystals 6 may partly jump out from the surface of melt zone 2 or partly jump out due to the collision of the granular crystals with each other or partly explode or scatter due to the expansion of gas (for example, hydrogen gas, chlorine gas, etc.) remaining in the inside of the raw material. As a result, a considerable part of the granular crystals 6 leave the surface of the melt zone so as not to be supplied as the melt, so that they cannot function as a raw material. Furthermore, they scatter in the inside of the apparatus to thereby form a contamination source. Furthermore, the granular crystals 6 may be transferred along the surface of the melt zone to the peripheral solid-liquid interface, so that the granular crystals 6 in a liquid phase may be solidified in the solid-liquid interface or may be quenched due to the thermal impact thereof to produce the cause of polycrystallization or abnormal crystallization (deformation) of the grown crystal. On the contrary, in this embodiment, there is provided a barrier enclosure by which the above-mentioned crystal particles can be forced to remain in the inside of the barrier enclosure because the crystal particles are prevented from scattering to the periphery, and by which the crystal particles can be melted rapidly because they are subjected to induction heating from the high frequency coil. If the supplied granular crystals are pre-heated, the melting of the crystal particles can be performed easier.

When the ingot 1 in this state is moved down while rotating, the bottom portion of the melt zone 2 is solidified. By supplying the granular crystals 6 as a raw material continuously while keeping both the supply rate of the raw material and the equilibrium or balanced state of solidification constant, the growing of the ingot 1 can be performed. Further, by adjusting the balanced state to change the diameter of the ingot 1 (in accordance with a diameter enlarging program), a large-size (large-diameter and long) ingot (of monocrystals or polycrystals) can be produced.

In the case of production of a semiconductor crystal, it is necessary to adjust the dopant concentration of the crystal because the purity and electric characteristic of the crystal are determined by the dopant concentration. Therefore, particles of a metal such as antimony, boron, etc. or particles of an alloy composed of the metal and silicon may be added to the raw material granular crystals in a predetermined proportion in a period of crystal growth. Alternately, granular crystals to which a dopant is added preliminarily may be used as a raw material or may be added to the raw material. In this manner, silicon monocrystals having a desired conducting form of p-type or n-type can be obtained continuously in the period of crystal growth. In the conventional FZ method, it is difficult to change the dopant adding process on the way to crystal growth because the dopant is added to the raw material crystals in advance. As a measure to add these impurities (dopant) to the raw material, there may be employed a method of introducing and mixing the impurities by using a branch guide pipe or a plurality of guide pipes as well as the main raw material guide pipe 7.

Next, the second embodiment of the present invention will be described below.

As a heating method for melting the whole upper portion of growing monocrystals or polycrystals, any method can be selected from high frequency induction method, electron beam radiation method, infrared radiation method, resistance heating method, arc discharging method, oxyhydrogen flame method, etc. These methods, however, have both merits and demerits. The electron beam radiation method requires a vacuum, so that the atmospheric condition can be hardly changed because this method can be less used under the no-pressure or pressure condition. Further, this method has a disadvantage in that the concentration of gasifiable dopant or component is apt to change easily. In the infrared radiation method using infrared radiation light, there is a tendency that unevenness and instability in energy distribution are caused by production of a shadow due to the barrier enclosure, scattering of light and reflection/absorption in accordance with the shape of the liquid surface. In the resistance heating method, there is a tendency that contamination occurs easily due to contact with a heating body and that a change with the passage of time occurs easily due to the consumption of the heating body. In the arc discharging method, there is a tendency that heating is concentrated locally, and it is difficult to heat a wide area evenly. In the oxyhydrogen flame method, it is difficult to heat a wide area stably because there is a tendency that the method is intensively affected by an atmosphere of oxidation-reduction. On the contrary, in the high frequency induction heating method, power can be applied to the whole region of the melt zone evenly, and accordingly, power can be applied concentrately to the granular crystals in the barrier enclosure provided in the center portion. In the high frequency induction heating method, accordingly, the granular crystals can be melted easily so that they can be supplied continuously as a raw material melt. In the high frequency induction heating method, furthermore, not only the atmospheric condition (pressure, no-pressure, reduced-pressure, atmospheric gas, etc.) can be changed easily because this method does not require a vacuum, but scattering of light due to the barrier enclosure in the case of light heating can be avoided. Because the high frequency coil is water-cooled, not only contamination with impurities derived from the coil can be prevented but a change with the passage of time can be avoided. Further, thermal loss due to radiation can be prevented by polishing the surface of the coil. As mentioned above, the high frequency induction heating method is most suitable for the implementation of the present invention and excellent in safety, apparatus size and stable production.

Next, the third embodiment of the present invention will be described below.

As described above, in order to carry out crystal growth continuously, it is necessary to melt the supplied raw material granular crystals rapidly without scattering thereof and without solidification thereof at the solid-liquid interface. It is preferable from the viewpoint of production that thermal and mechanical impacts caused by the supplied granular crystals are reduced.

This embodiment is established on the basis of the above standpoint. That is, in the configuration of this embodiment, a bottom is provided in the lower portion of the barrier enclosure, and a hole or a plurality of holes are formed in the bottom portion. Further, a melt in the inside of a vessel including the barrier enclosure and a floating zone melt in the outside of the vessel are connected to each other through the holes in the bottom portion of the vessel to thereby soften the propagation of mechanical vibration or thermal impact caused by the dropping granular crystals directly to the solid-liquid interface or to the surface of the floating zone melt. Accordingly, a more stable solid-liquid interface or a more stabilized floating zone surface can be obtained to thereby facilitate monocrystallization.

Specifically, as shown in FIGS. 3A and 3B, one hole or a plurality of holes 5-2 are provided in the bottom portion of the barrier enclosure 5 so as to be in contact with the surface of the floating zone melt or be partly immersed in the floating zone melt so that the melt 8 can be introduced in the barrier enclosure vessel. Alternatively, granular crystals in the barrier enclosure vessel are preliminarily melted by induction heating to produce the melt 8, and then the hole(s) are brought into contact with the liquid surface 2-1 of the floating zone 2 or partly immersed in the floating zone 2 so that the melt 8 can be connected to the floating zone melt. When granular crystals are then introduced into the barrier enclosure 5 and melted in the liquid surface 8-1 within the barrier enclosure 5, the melt 8 is supplied to the floating zone melt 2 through the hole(s) 5-2 in the lower portion of the barrier enclosure 5. Because the depth of the floating zone melt 2 in the vicinity of the center portion thereof is generally in a range of from 7 m to 9 m in the case of the growth of a silicon monocrystal with the diameter of 6 inches, the bottom portion of the barrier enclosure is not in contact with the solid-liquid interface even when the bottom portion is immersed by a depth of from 2 mm to 5 mm in the melt. The diameter D of the hole(s) is generally set in a range of from 3 mm to 8 mm.

Next, the fourth embodiment of the present invention will be described below.

According to the second embodiment, granular crystals can be supplied continuously and stably while reducing mechanical and thermal impacts, so that an ingot of monocrystals can be obtained. It is further preferable from the viewpoint of production that the diameter (size) of a starting initial ingot is as small as possible or a large-size crystalline ingot is obtained directly by starting from a seed crystal (with the diameter of from 3 mm to 8 mm and the length of from 30 mm to 100 mm). In the case of silicon, a neck making operation is indispensable to elimination of dislocation of a grown crystal obtained by starting from such a small-diameter monocrystal.

The fourth embodiment is established on the basis of the above standpoint. This embodiment is characterized in that at least one hole is provided in the bottom portion of the barrier enclosure, the bottom portion being flat or inclined toward the hole (toward its center). Accordingly, this embodiment can be applied even to the case where the upper end portion of the seed crystal at the time of starting of crystal growth is smaller in diameter than the barrier enclosure. Specifically, as shown in FIG. 3C, when a small amount of granular crystals are introduced into the vessel having the barrier enclosure 5, the granular crystals 6 are efficiently collected substantially to the center because of the inclination toward the hole 5-2 and then melted by induction heating (coil 4). In this case, granular crystals or crystal pieces (having a larger diameter than the diameter of the hole) may be introduced into the vessel in advance. The melt is held while it is fitted to the wall of the vessel and while it is kept in a layer shape or a spherical shape 8 with the height of from 5 mm to 10 mm by the surface tension of itself. Further, in the case where the melt 8 is above the center position of the high frequency coil, the melt 8 is affected by levitation effect (floating effect) based on repulsion of an induction current so that the melt 8 is held easily. At this time, the hole 5-2 in the bottom portion is also filled with the melt (hatching portion in FIG. 3C).

If a small-diameter seed crystal 9 is preliminarily disposed in the lower of the center portion of the hole provided in the bottom portion of the vessel before initial granular crystals are introduced or arranged into the vessel, the granular crystals can be melt without falling down out of the hole while the lower portion of the melt can be brought into contact with the seed crystal to melt a part of the forward end of the seed crystal. Thus, seeding can be perfected. That is, there is established a state where the melt zone is held on the upper end of the seed crystal because of the surface tension and the levitation effect. Further, the same state as described above can be obtained even in the case where the seed crystal diameter D' is larger than the hole diameter D.

When the seed crystal is then moved down while rotating after the temperature is controlled by output adjustment, the lower portion of the melt is solidified so that monocrystals are grown up. When the seed crystal is further moved down while granular crystals are supplied into the vessel, the granular crystals are melted so as to be united with the melt 8 in the barrier enclosure vessel 5 and then the melt is supplied to the floating zone liquid 2 through the hole of the bottom portion. As a result, not only the seed crystal can be grown further continuously but the diameter thereof can be enlarged. As the diameter of the grown crystal increases, the contact area between the melt 8 and the wall of the vessel is widened. Finally, each of the diameter of the grown crystal and the diameter of the melt zone liquid exceeds the diameter of the barrier enclosure, so that there is established the same state as described above in the third embodiment with reference to FIG. 3A. Thus, the growth of a large-size crystal can be continued in the same manner as in the above-mentioned embodiment.

Next, the fifth embodiment of the present invention will be described below.

As described above, an ingot of monocrystals can be obtained in a manner in which granular crystals are supplied continuously. In the case of a semiconductor crystal, however, distribution control of the dopant concentration of the crystal as an electrical characteristic, that is, resistivity control, is essential thereto as well as the crystal perfection and the purity of the semiconductor crystal. Further, there is a tendency that vibration or resonance due to electrical induction or mechanical vibration occurs in the surface of the melt zone. It is therefore important to prevent the vibration or resonance to thereby obtain stable production.

This embodiment is established on the basis of the above-mentioned standpoint. That is, the configuration of this embodiment is in that one flat plate or a plurality of flat plates arranged in the vicinity of the bottom side portion of the barrier enclosure, and substantially concentrically along the outer circumference of the barrier enclosure, are employed. In this case, the flat plate(s) and the barrier enclosure may be united into one body, or they may be arranged separately.

In general, impurities (dopant) added to raw material particles in advance or separately, for example, metal elements such as antimony, arsenic, phosphorus, etc. are so high in vapor pressure at a high temperature that they are vaporized easily from the surface of the melt zone. As a result, there arises a variation of the dopant concentration in the lengthwise direction of a monocrystal, an uneven distribution in the radial direction thereof, etc. easily, so that the yield of products is reduced remarkably. Further, there is the possibility that the inside of the apparatus is contaminated with deposition of the vaporized impurities on the periphery thereof. On some occasion, there is the possibility that an abnormality such as electric discharge between the high frequency coil and the crystal occurs.

In this embodiment, therefore, as shown in FIGS. 4A and 4B, the whole or a part of the free surface, except the peripheral solid-liquid interface, of the melt zone 2 is covered with the solid flat plate(s) 10, or the flat plate(s) are brought into contact with the surface of the melt 2. Accordingly, not only the impurities can be prevented from being vaporized but the free surface can be prevented from vibrating/resonating electrically/mechanically. As a result, the effect of stabilizing the temperature of the melt zone can be improved. Further, by selecting the material, shape, effective area ratio (rate of the area of the melt zone to the area of the flat plate), etc. of the solid flat plate(s) 10 or rod(s), the flat plate(s) 10 can be provided so as to function as a dopant source to thereby adjust the dopant concentration and the dopant distribution in wide ranges respectively. Examples of the dopant source used for silicon include boron sources such as pyrolytic boron nitride (BN), and boron nitride, composite materials of silicon nitride ($Si_3N_4$), silicon carbide (SIC) and additive impurities, oxygen sources such as quartz, etc.

Further, vaporizable components have a tendency that they are vaporized and deposited on the cooled high frequency coil in the vicinity of the components to thereby cause electric discharge between the melt and the coil. In this embodiment, however, the electric discharge can be prevented because the surface of the melt is covered with the flat plate(s) 10.

Next, the sixth embodiment of the present invention will be described below.

In the present invention, there is no external vessel for putting the floating zone melt therein, so that the floating zone melt is held on the crystal on the basis of the balance between the melt and the surface tension thereof. Accordingly, the floating zone melt is easily affected by mechanical vibration, convection in the melt, etc. so that irregular vibration occurs easily in the floating zone. In some cases, there arise problems in abnormal crystal growth, deformation, falling of the melt from the grown crystal, etc. Further, the flatness of the solid-liquid interface between the melt and the grown crystal is disturbed easily by the uneven temperature distribution, so that distortion of the inside of the crystal and striped uneven distribution (striation) of precipitated impurities occur to bring about the deterioration of the quality of the crystal. It is therefore necessary to keep the floating zone melt more stable and keep the temperature gradient uniform vertically.

This embodiment is established on the basis of the above-mentioned standpoint. That is, the configuration of this embodiment is in that a magnetic field substantially perpendicular or parallel to the axis of the crystal growth is applied to the floating zone melt region. The intensity of the applied magnetic field is generally in a range of from 1000 to 5000 gausses. If the melt having an electric conductivity slightly crosses over a magnetic field because of thermal movement or convection, an electric field is generated in accordance with Fleming's rule. By the interaction thereof, the fluidity of the melt both in its inside and on its surface is suppressed, so that the convection as well as the vibration of the melt can be suppressed. As a result, there are attained the effects in maintenance of the flatness of the solid-liquid interface, improvement of the uneven distribution of additive impurities, suppression of vaporization of the additive impurities and component raw material, etc. Accordingly, stable production and improvement of the quality of the grown crystal can be attained by application of magnetic field, so that the effects of the present invention can be made more effectively.

Having described the features of the present invention on the basis of several embodiments thereof, the merits of the embodiments will be summarized as follows.

In the first embodiment, raw material granular crystals are effectively guided onto a limited region of the surface of the floating zone melt because a barrier enclosure is used. Thus, there is provided a process in which the granular crystals are melted directly on the surface of the melt surface and supplied while the granular crystals are prevented from scattering.

In the second embodiment, heating is performed by high frequency induction, so that not only heat-melting of granular crystals in the barrier enclosure can be made efficiently through concentration of high frequency induction but the high frequency induction heating can be made evenly over the whole surface of the floating zone. Further, not only the melt as a raw material within the barrier enclosure is held by the levitation effect to form a melt reservoir to thereby make it possible to melt the granular crystals rapidly, but seeding can be performed stably through the hole(s) in the bottom portion of the barrier enclosure without leakage of the melt out of the hole(s). Thus, an optimum process for carrying out the present invention can be provided.

In the third embodiment, the melt in the vessel is connected to the floating zone melt through the hole(s) in the bottom portion of the vessel having the barrier enclosure, so that the granular crystals are supplied to the floating zone melt through the hole(s) after the granular crystals are once heat-melted while held in the barrier enclosure having the bottom surface. Accordingly, even in the case where the raw material granular crystals are introduced directly onto the floating zone melt, the mechanical and thermal impacts can be lightened. Thus, there is provided a process in which the raw material melt can be supplied smoothly.

In the fourth embodiment, the bottom surface of the vessel having the barrier enclosure is inclined toward the hole(s) so that the melt of granular crystals or crystal pieces is held above the center position of the high frequency heating coil. Accordingly, seeding is performed through the hole(s) provided in the bottom surface of the barrier enclosure while the spherical melt is held in air without dropping on the basis of the adhesion of the wall of the vessel and the lift in accordance with the levitation effect. Thereafter, continuous supply of the raw material is made. Thus, there is provided a process in which it is made possible to grow a non-dislocation large-diameter long crystal from a small-diameter seed crystal.

In the fifth embodiment, there is provided a process in which not only particle impact, mechanical/electrical vibration, vaporization of impurities and vaporization of component elements can be suppressed but dopant importers can be added to the grown crystal on the way to crystal growth through selection of the material therefor.

In the sixth embodiment, there is provided a process in which not only the surface vibration of the floating zone melt can be prevented by application of magnetic field to the floating zone melt region to thereby stabilize production but the convection of the melt is suppressed to make the solid-liquid interface more flat to thereby make the dopant distribution of the grown crystal more uniform.

Materials and parts used in the above description will be explained supplementarily.

(1) The particle size of the raw material granular crystals 6 is selected to be in a range of from about 0.5 mm to about 5.0 mm. The diameter and length of the seed crystal (solid crystal) 9 are generally selected to be in a range of from 3 mm to 7 mm and in a range of from about 30 mm to about 100 mm, respectively. Monocrystals (having uniform crystallographic axes) or polycrystals (having many crystallographic axial orientations and many crystal grain faces) may be used as the raw material granular crystals 6 and as the seed crystal 9. These crystals are selected in accordance with the purpose of use as to whether the crystal products to be obtained are monocrystals or polycrystals or as to what products both in composition and in crystal structure are to be obtained. Examples of the raw material include not only silicon but germanium, compound semiconductors, metals, alloys, oxides, compounds, ceramics, etc. Further, the melt may be constituted by a single composition or may be constituted by a stoichiometric composition, a non-stoichiometric composition or a solvent composition.

(2) As described above, the barrier enclosure is disposed so that its lower end portion is in the vicinity of the surface of the melt. That is, the distance 1 between the lower end portion of the barrier enclosure and the surface of the melt satisfies $1 \leq d$ (d representing the particle size), $1=0$ or the positional relation in which the lower end portion of the barrier enclosure is slightly immersed in the melt so as to be under the surface of the melt. Although FIG. 3 shows an example of the structure of the barrier enclosure, the structure of the barrier enclosure may be changed so that a funnel-shaped or curved bottom surface portion may be provided as a part of the barrier enclosure. The bottom surface portion is in contact with the surface of the melt or immersed in the melt so that the melt in the barrier enclosure is connected to the melt through the hole(s) provided in the bottom surface portion.

(3) By providing the barrier enclosure, as described above, not only are the granular crystals dropping down are prevented from jumping up at the surface of the melt, scattering and jumping out of the surface of the melt but polycrystallization or abnormal crystal growth is prevented from being caused by generation of crystal cores based on the deposition of the scattering granular crystals onto the solid-liquid interface between the grown monocrystal and the free surface of the melt. Further, not only are the granular crystals are subjected to pre-heating while the granular crystals are limited in a predetermined range within the barrier enclosure, but the granular crystals are subjected to concentrated induction heating to thereby make it possible to increase the melting speed.

The material for the barrier enclosure is selected in accordance with the purpose and condition. Examples of the material used include quartz, alumina ($Al_2O_3$), silicon nitride ($Si_3N_4$), silicon carbide (SIC), carbon, boron nitride (BN), boron carbide ($B_4C$), ceramics, metals (platinum, iridium, gold, silver, copper, etc.), metal alloys, etc.

The shape of the barrier enclosure is selected in accordance of the purpose of use. Examples of the shape used include a cylindrical shape, a polygonal shape, a funnel shape, an inverted funnel shape, and a combination of these shapes. Further, (a) slit(s) or mesh(es) may be provided in the shape of the barrier enclosure. Further, the bottom portion of the barrier enclosure is selected in accordance with the purpose of use. For example, the bottom portion may be of an open type as described above or may be provided with a bottom plate of the above-mentioned shape (plate shape, funnel shape or curved shape). Further, (a) hole(s) or slit(s) may be formed in the bottom plate.

The height of the barrier enclosure is selected so that the granular crystals can be prevented from scattering out of the barrier enclosure and from being deposited on the high frequency coil. Although the effective diameter of the barrier enclosure is generally selected to be smaller than the inner diameter of the high frequency induction coil, the same effect can be obtained also in the case where the effective diameter of the barrier enclosure is larger than the inner diameter of the coil if the diameter of the contact or proximity portion between the barrier enclosure and the melt is not larger then the diameter of the melt zone. The inner diameter of the coil is preferably selected to be as small as possible for improving the concentration of power and the reflection plate effect (prevention of heat radiation).

The barrier enclosure may be mounted on a fixed/movable/rotatable holder through a holding terminal, plate, rod, beam, or the like. Further, the barrier enclosure may be combined with the forward end of the granular crystal guide pipe 7 so as to be fixed or may be united therewith into one body. Further, an optimum structure of the barrier enclosure may be selected exchangeably manually or automatically on the way to crystal growth.

(4) By covering the surface of the melt with one flat plate or a plurality of flat plates 10 disposed in the vicinity of the bottom side portion of the barrier enclosure and concentrically or radially along the outer circumference of the disclosure, vibration of the surface of the melt caused by dropping of the granular crystals and induction vibration caused by a high frequency electric source can be prevented as described above. Examples of the vaporizable component include impurities (for example, antimony, arsenic, phosphorus, etc. contained in silicon), component elements (for example, antimony, arsenic, phosphorus, etc. contained in Group III-Group V compound semiconductors), and the like. The flat plate 10 may be constituted by a single plate or, alternatively, it may be constituted by a combination of a plurality of plates disposed radially.

As described above in detail, the present invention has the following effects.

According to the present invention, because raw material granular crystals are supplied for manufacturing grown crystals through a floating zone method, a preliminarily processed large-size raw material ingot which has been required in the conventional FZ method is not required. Accordingly, the manufacturing apparatus can be simplified both in size and structure. Further, energy for pre-heating the raw material ingot is less required, so that required electric power can be reduced remarkably. Further, a large-size monocrystal can be produced easily and directly from the granular crystals. As a result, there arises an excellent effect that producing efficiency is improved to make remarkable reduction in cost possible.

Further, because a barrier enclosure having its end disposed in the vicinity of the upper surface of the heat-melt body is provided to facilitate the supply of raw material granular crystals, there arises another excellent effect that not only can raw material loss and contamination of the inside of the apparatus caused by scattering of crystal particles can be prevented but deformation and polycrystallization of ingot products caused by flowing of floating matter from surfaces of raw material crystal particles to the surface of the melt can be prevented.

Further, in comparison with the conventional CZ method, according to the present invention, it is unnecessary to use expensive quartz and carbon crucibles. Accordingly, it is a matter of course that there is less probability of contamination with impurities, heavy metals, etc. derived from these crucibles. Accordingly, high purification can be made easily. There arises a further excellent effect that not only can safety can be improved but the melt zone region can be reduced to thereby attain energy saving.

What is claimed is:

1. An apparatus for manufacturing crystals through a floating zone method, which comprises: means for forming a heat-melt zone so as to be held at an upper portion of a solid crystal; a barrier enclosure having an opening at a lower end portion thereof and provided in the vicinity of an upper surface of said heat-melt zone; means for supplying a raw material granular crystal into said barrier enclosure; and means for moving said solid crystal and said heat-melt zone forming means relative to each other to thereby bring about crystal growth, wherein said barrier enclosure has a bottom surface being flat or inclined toward the center of said barrier enclosure, and wherein said opening is constituted by at least one hole formed in said bottom surface of said barrier enclosure.

2. An apparatus for manufacturing crystals through a floating zone method according to claim 1, wherein seeding is performed through said at least one hole formed in said barrier enclosure.

3. An apparatus for manufacturing crystals through a floating zone method according to claim 2, wherein at least one flat plate is provided in the vicinity of a bottom side portion of said barrier enclosure so as to be disposed concentrically or radially along the outer circumference of said barrier enclosure.

4. An apparatus for manufacturing crystals through a floating zone method according to claim 2, wherein said apparatus further comprises a magnetic field applying means for applying a magnetic field to a melt region of said heat-melt zone.

5. An apparatus for manufacturing crystals through a floating zone method according to claim 1, wherein at least one flat plate is provided in the vicinity of a bottom side portion of said barrier enclosure so as to be disposed concentrically or radially along the outer circumference of said barrier enclosure.

6. An apparatus for manufacturing crystals through a floating zone method according to claim 1, wherein said apparatus further comprises a magnetic field applying means for applying a magnetic field to a melt region of said heat-melt zone.

7. An apparatus for manufacturing crystals through a floating zone method, which comprises: means for forming a heat-melt zone so as to be held at an upper portion of a solid crystal; a barrier enclosure having an opening at a lower end portion thereof and provided in the vicinity of an upper surface of said heat-melt zone; means for supplying a raw material granular crystal into said barrier enclosure; and means for moving said solid crystal and said heat-melt zone forming means relative to each other to thereby bring about crystal growth, wherein at least one flat plate is provided in the vicinity of a bottom side portion of said barrier enclosure so as to be disposed concentrically or radially along the outer circumference of said barrier enclosure.

8. An apparatus for manufacturing crystals through a floating zone method according to claim 7, wherein said apparatus further comprises a magnetic field applying means for applying a magnetic field to a melt region of said heat-melt zone.

9. An apparatus for manufacturing crystals through a floating zone method, which comprises: means for forming a heat-melt zone so as to be held at an upper portion of a solid crystal; a barrier enclosure having an opening at a lower end portion thereof and provided in the vicinity of an upper surface of said heat-melt zone; means for supplying a raw material granular crystal into said barrier enclosure; and means for moving said solid crystal and said heat-melt zone forming means relative to each other to thereby bring about crystal growth, wherein said heat-melt zone forming means is constituted by a high frequency induction heating device and said barrier enclosure has a bottom surface being flat or inclined toward the center of said barrier enclosure, and wherein said opening is constituted by at least one hole formed in said bottom surface of said barrier enclosure.

10. An apparatus for manufacturing crystals through a floating zone method means for forming a heat-melt zone so as to be held at an upper portion of a solid crystal; a barrier enclosure having an opening at a lower end portion thereof and provided in the vicinity of an upper surface of said heat-melt zone; means for supplying a raw material granular crystal into said barrier enclosure; and means for moving said solid crystal and said heat-melt zone forming means relative to each other to thereby bring about crystal growth, wherein said heat-melt zone forming means is constituted by a high frequency induction heating device and at least one flat plate is provided in the vicinity of a bottom side portion of said barrier enclosure so as to be disposed concentrically or radially along the outer circumference of said barrier enclosure.

* * * * *